(12) United States Patent
VanBuskirk et al.

(10) Patent No.: US 7,781,806 B2
(45) Date of Patent: Aug. 24, 2010

(54) OPTICAL ERASE MEMORY STRUCTURE

(75) Inventors: Michael VanBuskirk, Saratoga, CA (US); Mark McClain, San Diego, CA (US)

(73) Assignee: Spansion LLC, Sunnyvale, CA (US)

( * ) Notice: Subject to any disclaimer, the term of this patent is extended or adjusted under 35 U.S.C. 154(b) by 232 days.

(21) Appl. No.: 12/106,180

(22) Filed: Apr. 18, 2008

(65) Prior Publication Data

US 2009/0261367 A1   Oct. 22, 2009

(51) Int. Cl.
*H01L 27/148*   (2006.01)

(52) U.S. Cl. .................. 257/225; 257/98; 257/324; 257/462; 257/E27.127; 438/24; 438/29

(58) Field of Classification Search ............ 257/98, 257/225, 324, 462, E27.127; 438/24, 29
See application file for complete search history.

(56) References Cited

U.S. PATENT DOCUMENTS

| | | | |
|---|---|---|---|
| 5,987,196 A | 11/1999 | Noble | |
| 6,097,857 A | 8/2000 | Feldman | |
| 6,121,656 A * | 9/2000 | Tanaka et al. | 257/323 |
| 6,706,546 B2 | 3/2004 | Yoshimura et al. | |
| 2002/0185646 A1* | 12/2002 | Fukasawa et al. | 257/79 |
| 2007/0126043 A1* | 6/2007 | Moon et al. | 257/298 |
| 2008/0290353 A1* | 11/2008 | Medendorp et al. | 257/89 |

\* cited by examiner

*Primary Examiner*—Tu-Tu V Ho
(74) *Attorney, Agent, or Firm*—Mikio Ishimaru

(57) ABSTRACT

A method for providing an optical erase memory structure including: forming a metal-insulator-metal memory cell; positioning a light emitting diode adjacent to the metal-insulator-metal memory cell; and emitting a light emission from the light emitting diode for erasing the metal-insulator-metal memory cell.

20 Claims, 4 Drawing Sheets

OPTICAL ERASE MEMORY STRUCTURE

TECHNICAL FIELD

The present invention relates generally to non-volatile memory systems, and more particularly to optical erase memory structures integrated either within a single die or by a multiple die packaging system.

BACKGROUND ART

Consumer electronics of today, such as personal video players and digital cameras, utilize more memory than the mainframe computers of the nineteen seventies and eighties. Non-volatile memory devices generally include arrays of memory cells that retain information without electrical power being supplied to the memory device. The memory cells maintain information in an "off" or an "on" state, also referred to as "0" and "1". Each memory cell can be "written" (programmed) with information, "read", and "erased". Typically, a memory device is addressed to retrieve a specified number of byte(s) (e.g., 8 memory cells per byte). Such memory devices are usually fabricated from semiconductor devices that perform these various functions and are capable of switching and maintaining the two states. The devices are often fabricated with solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, the scaling of conventional MOSFET based memory devices is approaching fundamental physical limits. Therefore, there is a need to overcome the physical limits of conventional memory devices.

One approach to increasing memory device density is the use of a metal-insulator-metal (MIM) memory cell. A MIM cell may include a first electrode, an active resistive layer on the first electrode, and a second electrode on the active layer. Initially, assuming that the memory cell is un-programmed, in order to program the memory cell, ground is applied to the first electrode, while a positive voltage is applied to the second electrode, so that an electrical potential $V_{pg}$ (the "programming" electrical potential) is applied across the memory cell from a higher to a lower electrical potential in the direction from the second electrode to the first electrode. Upon removal of such potential the memory cell remains in a conductive or low-resistance state having an on-state resistance.

In the read step of the memory cell in its programmed (conductive) state, an electrical potential $V_r$ (the "read" electrical potential) is applied across the memory cell from a higher to a lower electrical potential in the direction from the second electrode to the first electrode. This electrical potential is less than the electrical potential $V_{pg}$ applied across the memory cell for programming (see above). In this situation, the memory cell will readily conduct current, which indicates that the memory cell is in its programmed state.

In order to erase the memory cell, a positive voltage is applied to the first electrode, while the second electrode is held at ground, so that an electrical potential $V_{er}$ (the "erase" electrical potential) is applied across the memory cell from a higher to a lower electrical potential in the direction from the first electrode to the second electrode.

In the read step of the memory cell in its erased (substantially non-conductive) state, the electrical potential $V_r$ is again applied across the memory cell from a higher to a lower electrical potential in the direction from the second electrode to the first electrode as described above. With the active layer in a high-resistance or substantially non-conductive state, the memory cell will not conduct significant current, which indicates that the memory cell is in its erased state.

Typically, programming of a memory cell is achieved by applying a fixed number of pulses at constant voltage across the memory cell. Erasing the memory cell may be problematic because of physical differences between memory cells in a memory device array. The electrical potential required to achieve programming can vary between memory cells causing individual memory cells in the memory device array to be programmed to different levels. Applying a constant programming electrical potential, to a memory cell which is substantially greater than that required for programming, can result in over-programming making it extremely difficult to erase. Therefore, what is needed is an approach wherein, while proper programming of the memory cell is achieved erasure of the memory can be reliably performed in a rapid fashion.

Alternative erase mechanisms in MIM cells include the application of heat or light of an appropriate frequency in order to release trapped charges that change the insulating properties of the resistive layer. Relatively uniform intensity and wide distribution of light is believed to be easier to provide than heat in a silicon die or packaging system structure. Therefore, light based (optical) erase offers an easier to implement ability to erase large areas of a MIM memory array simultaneously. Optical erase may also offer the ability to erase over-programmed cells. Optical erase can be used in addition to or in replacement of the above described electrical erase mechanism.

Furthermore, the memory cell as thus far shown and described is capable of adopting two states, i.e., a first, conductive state, or "on" state, and a second, substantially non-conductive, or "off" state. Each memory cell thus can include information as to the state of a single bit, i.e., either 0 or 1. However, it would be highly desirable to be able to provide a memory cell which is capable of adopting any of a plurality of states, so that, for example, in the case where four different states of the memory cell can be adopted, two bits of information can be provided as chosen (for example first state equals 00, second state equals 01, third state equals 10, fourth state equals 11). This multi-level (ML) memory technology can significantly improve memory density and reduce the cost per bit.

MIM cells can significantly increase the density of a memory device as compared to conventional MOSFET based memory devices. An optical erase memory structure may provide parallel erase of many single or multi-bit MIM cells in order to provide rapid and reliable erase of high density MIM devices.

In view of the increasing demand for large amounts of memory in personal electronic devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance to meet competitive pressures in the non-volatile memory market, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an optical erase memory structure including: forming a metal-insulator-metal memory cell; positioning a light emitting diode adjacent to the metal-insulator-metal memory cell; and emitting a light emission from the light emitting diode for erasing the metal-insulator-metal memory cell.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
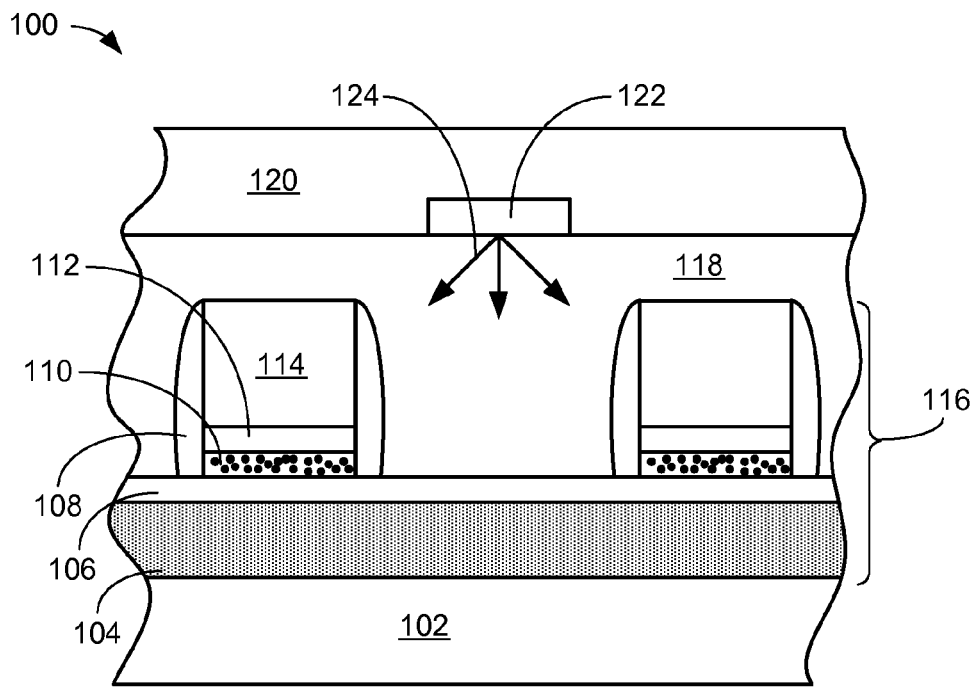
FIG. 1 is a cross-sectional view of an optical erase memory structure, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the semiconductor substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "transparent" means that the object so designated allows light to pass through it. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an optical erase memory structure 100, in an embodiment of the present invention. The cross-sectional view of the optical erase memory structure 100 depicts a first substrate 102 having a first conductive layer 104, such as a metal layer, patterned on the surface. A first insulation layer 106, such as an oxide layer, may be applied on the first conductive layer 104 and on the first substrate 102. A pattern of spacers 108 may be formed on the first insulation layer 106 and positioned over the first conductive layer 104. The spacers 108 serve to isolate a charge trap layer 110, such as a nitride layer, that may be formed on the first insulation layer 106.

A second insulation layer 112 is formed on the charge trap layer 110 between the spacers 108. A second conductive layer 114, such as a metal layer, may be formed on the second insulation layer 112. A metal-insulator-metal (MIM) memory cell 116 is formed by the stack of the first conductive layer 104, the first insulation layer 106, the charge trap layer 110, the second insulation layer 112, and the second conductive layer 114.

The MIM memory cell 116 provides an efficient structure for storing data. The erasure of the MIM memory cell 116 can be very difficult in the current state of the art memory devices. In order to simplify the erasure process, a light transmissive layer 118, such as a clear epoxy, silicon dioxide, or polyimide, may be deposited over the MIM memory cells 116. A second substrate 120 having a light emitting diode 122 may be mounted on the light transmissive layer 118. The second substrate 120 may be oriented such that the light emitting diode 122 is facing the first substrate 102. The light emitting diode 122 is further positioned between the MIM memory cells 116.

When the light emitting diode 122 is activated, a light emission 124 passes through the light transmissive layer 118 to the charge trap layer 110. The light emission 124 may activate the charge trap layer 110 allowing it to dissipate the charge and return to a neutral state without applying additional voltage, thus erasing the memory to an initial value. The wavelength of the light emission 124 may be selected to activate the specific material used to form the charge trap layer 110. The light emission 124 may be reflected from the first conductive layer 104 and the second conductive layer 114. The light emission 124 may pass through the first insulation layer 106, the spacers 108, and the second insulation layer 112.

It has been discovered that the MIM memory cell 116 may be erased by the light emission 124 independent of the amount of charge stored in the charge trap layer 110. This discovery allows a reliable and safe process for initializing the MIM memory cells 116. By enabling the reliable erasure of the MIM memory cell 116, it may be used to store multiple bits of information in a single instance of the MIM memory cell 116.

Figure 2:
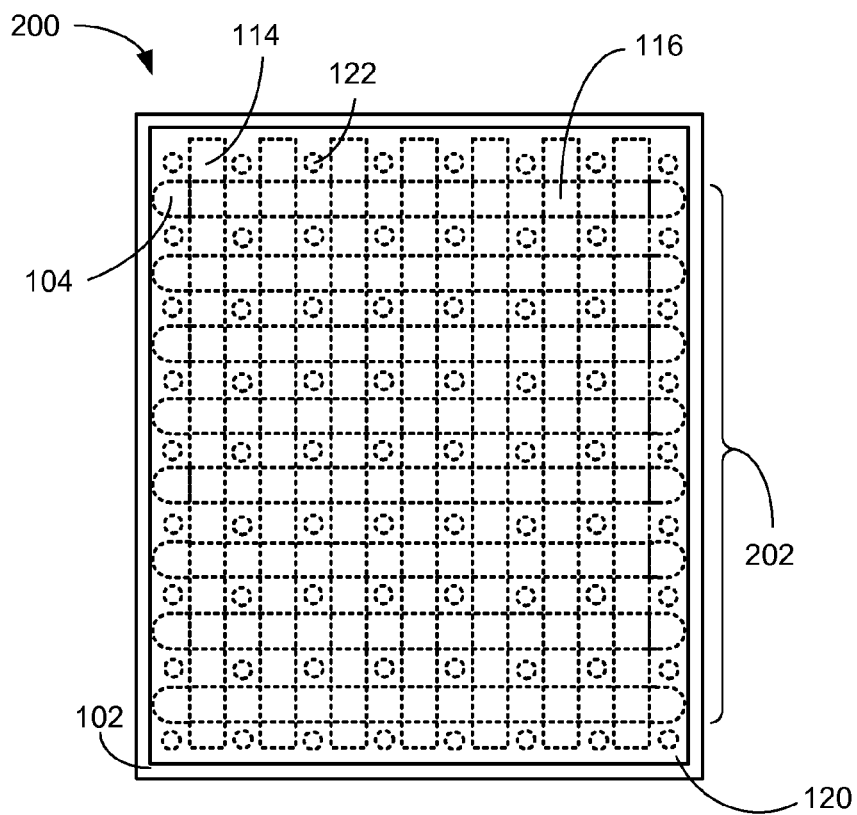
FIG. 2 is a top side plan view of an optical erase memory structure, in an embodiment of the present invention.

Referring now to FIG. 2, therein is shown a top side plan view of an optical erase memory structure 200 in an embodiment of the present invention. The top side plan view of the optical erase memory structure 200 depicts the first substrate 102 having the first conductive layer 104 distributed thereon. The second conductive layer 114 is routed in a direction perpendicular to the first conductive layer 104. The intersection of the first conductive layer 104 and the second conductive layer 114 forms the MIM memory cell 116. A MIM memory cell array 202 may be formed by multiple intersections of the first conductive layer 104 and the second conductive layer 114. For simplicity the first insulation layer 106, of FIG. 1, the spacers 108, of FIG. 1, the charge trap layer 110, of FIG. 1, and the second insulation layer 112, of FIG. 1, are not shown in this top plan view.

The second substrate 120 having the light emitting diode 122 positioned thereon is mounted over the first substrate 102. The light emitting diode 122 is positioned between the MIM memory cells 116 in the MIM memory cell array 202. A sufficient number of the light emitting diode 122 may be distributed on the second substrate 120 to assure the amount of the light emission 124 may erase all of the MIM memory cells 116.

The number and distribution of the first conductive layer 104, the second conductive layer 114, and the light emitting diode 122 is by way of an example only and the actual number and distribution may be different. The light emitting diodes 122 may be selectively activated in order to provide a segmented erase function that is limited to the MIM memory cells 116 in the region around the light emitting diode 122 that has been activated. The first substrate 102 may also have additional circuitry (not shown) for storing, retrieving, and transferring the data for the MIM memory cell array 202.

Figure 3:
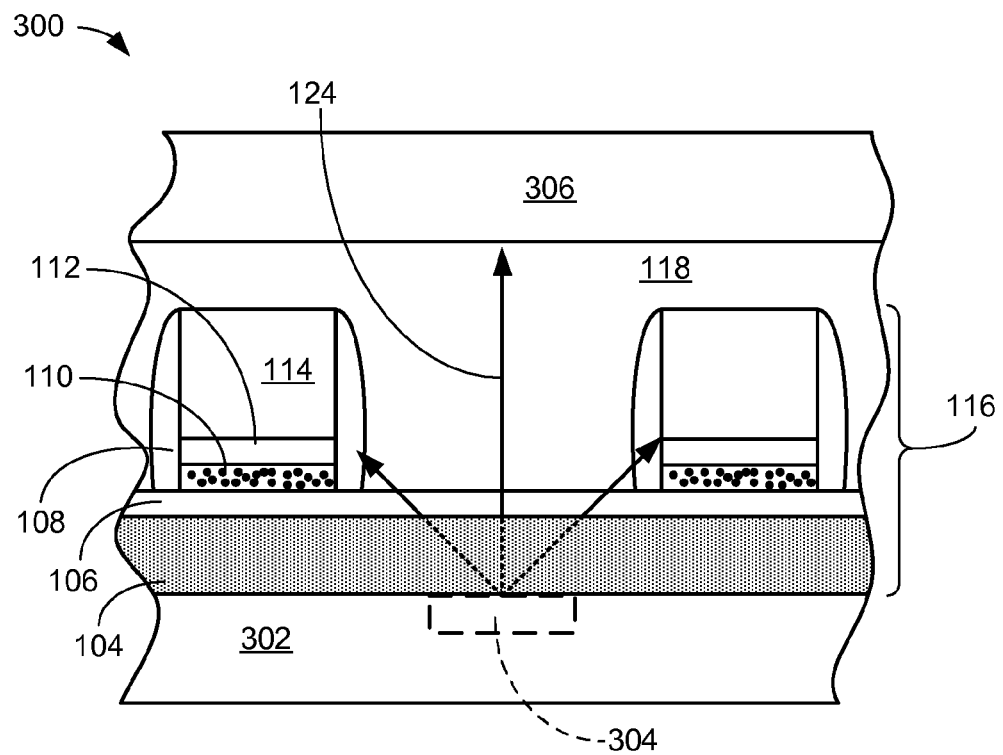
FIG. 3 is a cross-sectional plan view of an optical erase memory structure, in an alternative embodiment of the present invention.

Referring now to FIG. 3, therein is shown a cross-sectional plan view of an optical erase memory structure 300, in an alternative embodiment of the present invention. The cross-sectional view of the optical erase memory structure 300 depicts the optical erase elements integrated within a single structure. The structure includes a complete substrate 302 having a light emitting diode 304 formed therein. The first conductive layer 104 may be patterned on the surface of the complete substrate 302. The first insulation layer 106 may be applied on the first conductive layer 104 and on the complete substrate 302. A pattern of the spacers 108 may be formed on the first insulation layer 106 and positioned over the first conductive layer 104. The spacers 108 serve to isolate the charge trap layer 110, such as a nitride layer, that may be deposited on the first insulation layer 106.

The second insulation layer 112 is formed on the charge trap layer 110 between the spacers 108. The second conductive layer 114 may be formed on the second insulation layer 112. The MIM memory cell 116 is formed by the stack of the first conductive layer 104, the first insulation layer 106, the charge trap layer 110, the second insulation layer 112, and the second conductive layer 114. The position of the MIM memory cells 116 relative to the light emitting diode 304 may be adjusted to allow best exposure to the light emission 124. The light transmissive layer 118 covers the MIM memory cells 116 and a reflective layer 306, such as a metal layer, an opaque layer, or other non-transmissive layer, may be deposited thereon.

As previously described, the exposure of the MIM memory cells 116 to the light emission 124 will dissipate the charge in the charge trap layer without applying an erase voltage. This relieves the possibility of having the MIM memory cell 116 partially erased or one that may have a reverse charge when trying to program the next dataset.

Figure 4:
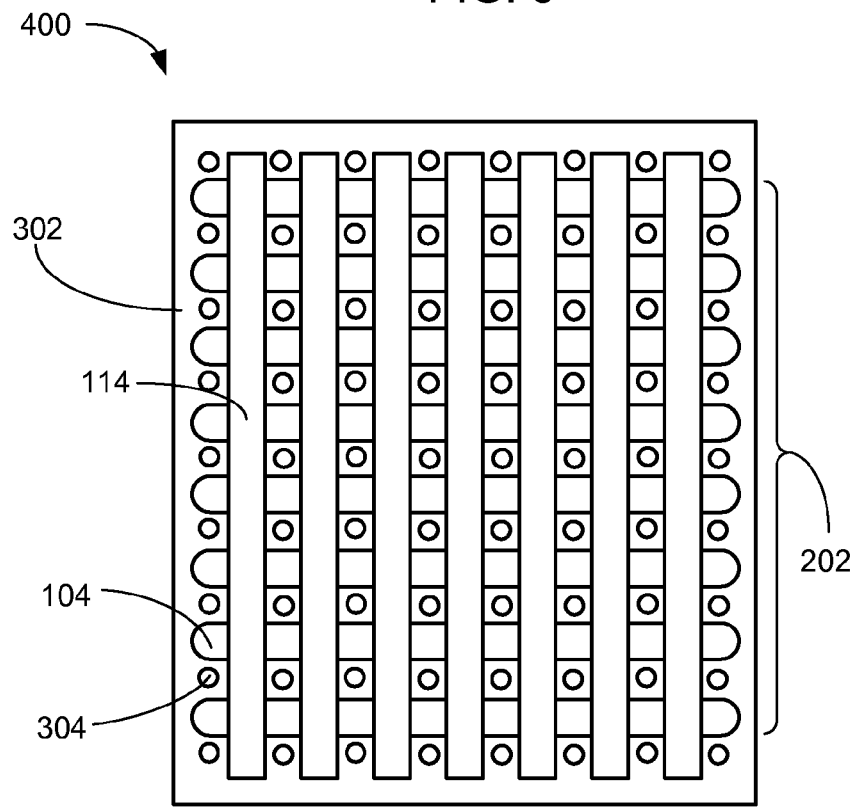
FIG. 4 is a top view of an optical erase memory structure, in an alternative embodiment of the present invention, in a deposition phase of manufacturing.

Referring now to FIG. 4, therein is shown a top view of an optical erase memory structure 400, in an alternative embodiment of the present invention, in a deposition phase of manufacturing. The top view of the optical erase memory structure 400 depicts the complete substrate 302 with the first conductive layer 104 distributed thereon. The second conductive layer 114 is routed in a direction perpendicular to the first conductive layer 104. The intersection of the first conductive layer 104 and the second conductive layer 114 forms the MIM memory cell 116, of FIG. 1. The MIM memory cell array 202 may be formed by multiple intersections of the first conductive layer 104 and the second conductive layer 114. For simplicity the first insulation layer 106, of FIG. 1, the spacers 108, of FIG. 1, the charge trap layer 110, of FIG. 1, and the second insulation layer 112, of FIG. 1, are not shown in this top plan view.

The light emitting diode 304 is positioned between the elements of the MIM memory cell array 202. This intermediate phase of manufacturing allows the relative positioning of the light emitting diodes to the intersections of the first conductive layer 104 and the second conductive layer 114 to be seen.

The number and distribution of the first conductive layer 104, the second conductive layer 114, and the light emitting diode 304 is by way of an example only and the actual number and distribution may be different. The light emitting diodes 304 may be selectively activated in order to provide a segmented erase function that is limited to the MIM memory cells 116, of FIG. 1, in the region around the light emitting diode 122 that has been activated. The complete substrate 302 may also have additional circuitry (not shown) for storing, retrieving, and transferring the data for the MIM memory cell array 202.

Figure 5:
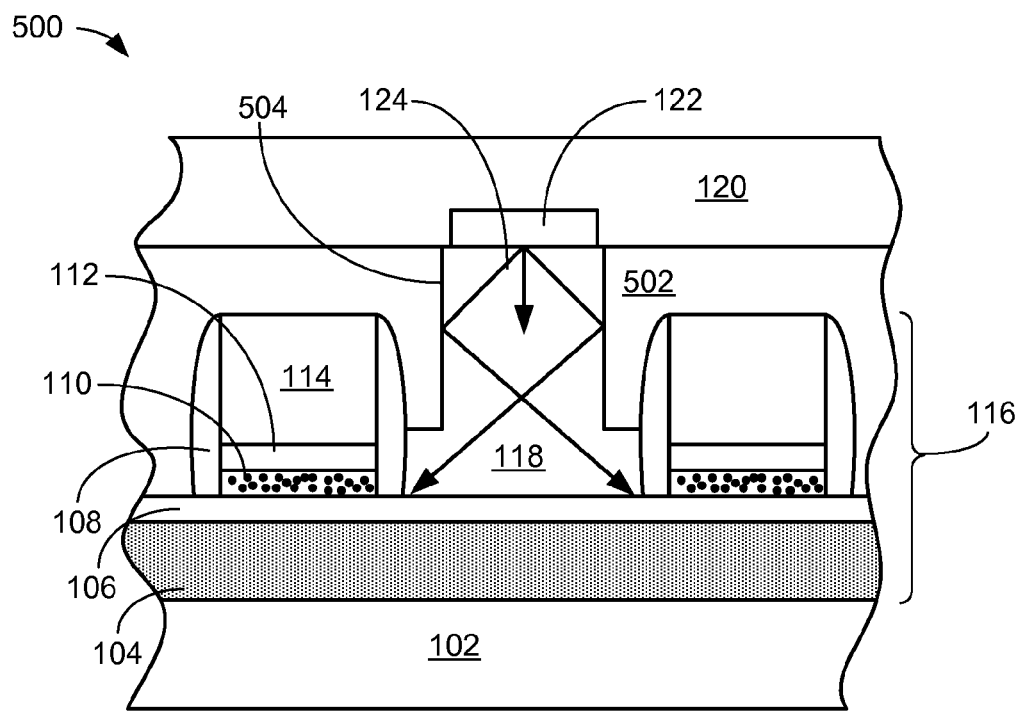
FIG. 5 is a cross-sectional view of an optical erase memory structure, with optical channeling structures.

Referring now to FIG. 5, therein is shown a cross-sectional view of an optical erase memory structure 500, with optical channeling structures. The cross-sectional view of the optical erase memory structure 500 depicts the first substrate 102 having the first conductive layer 104, such as a metal layer, patterned on the surface. The first insulation layer 106, such as an oxide layer, may be applied on the first conductive layer 104 and on the first substrate 102. A pattern of the spacers 108 may be formed on the first insulation layer 106 and positioned over the first conductive layer 104. The spacers 108 serve to isolate the charge trap layer 110, such as a nitride layer, that may be formed on the first insulation layer 106.

The second insulation layer 112 is formed on the charge trap layer 110 between the spacers 108. The second conductive layer 114, such as a metal layer, may be formed on the second insulation layer 112. The MIM memory cell 116 is formed by the stack of the first conductive layer 104, the first insulation layer 106, the charge trap layer 110, the second insulation layer 112, and the second conductive layer 114.

The MIM memory cell 116 provides an efficient structure for storing data. The erasure of the MIM memory cell 116 can be very difficult in the current state of the art memory devices. In order to simplify the erasure process, the light transmissive layer 118, such as a clear epoxy, silicon dioxide, or polyimide, may be deposited between the MIM memory cells 116. A non-transmissive layer 502 may be formed over the MIM memory cells 116. The combination of the light transmissive layer 118 and the non-transmissive layer 502 may form a light channeling interface 504.

The second substrate 120 having the light emitting diode 122 may be mounted on the light transmissive layer 118. The second substrate 120 may be oriented such that the light emitting diode 122 is facing the first substrate 102. The light emitting diode 122 is further positioned between the MIM memory cells 116.

When the light emitting diode 122 is activated, the light emission 124 passes through the light transmissive layer 118 to the charge trap layer 110. The interface between the light transmissive layer 118 and the non-transmissive layer 502 may reflect the light emission back into the light transmissive layer 118. By properly positioning the light channeling interface 504 it may be possible to control the amount of the light emission 124 that is delivered to the charge trap layer 110.

The light emission 124 may activate the charge trap layer 110 allowing it to dissipate the charge and return to a neutral state without applying additional voltage, thus erasing the memory to an initial value. The wavelength of the light emission 124 may be selected to activate the specific material used to form the charge trap layer 110. The light emission 124 may be reflected from the first conductive layer 104 and the second conductive layer 114. The light emission 124 may pass through the first insulation layer 106, the spacers 108, and the second insulation layer 112.

Figure 6:
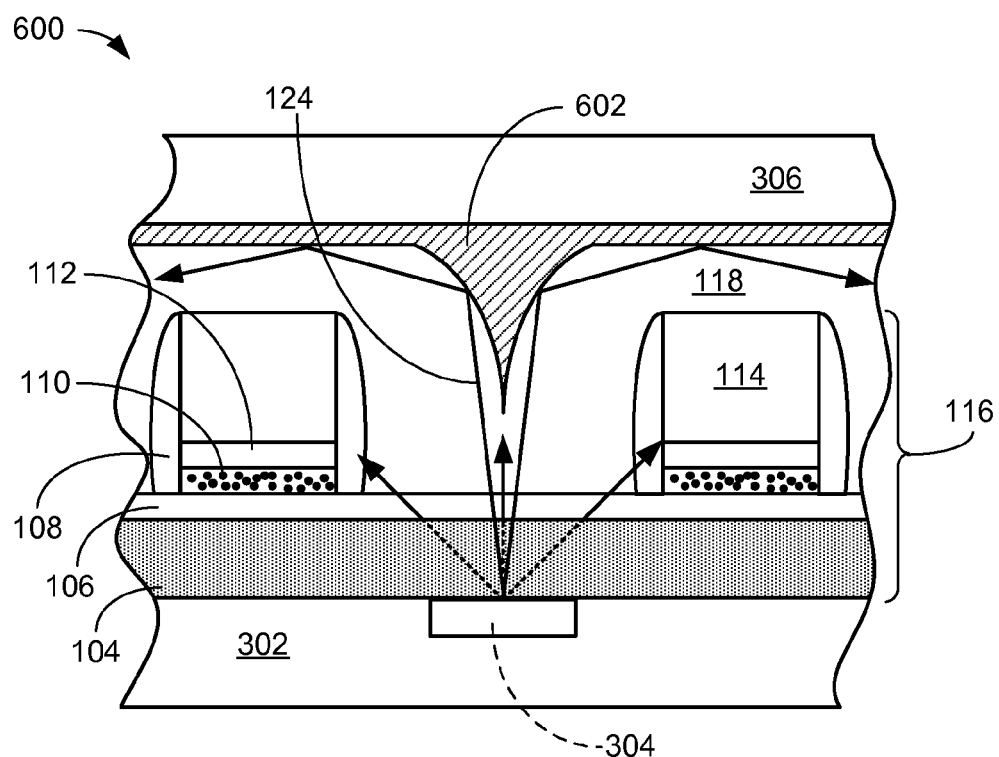
FIG. 6 is a cross-sectional view of an optical erase memory structure, with alternative optical channeling structures.

Referring now to FIG. 6, therein is shown a cross-sectional view of an optical erase memory structure 600, with alternative optical channeling structure. The cross-sectional view of the optical erase memory structure 600 depicts the complete substrate 302 having the light emitting diode 304 formed therein. The first conductive layer 104 may be patterned on the surface of the complete substrate 302. The first insulation layer 106 may be applied on the first conductive layer 104 and on the complete substrate 302. A pattern of the spacers 108 may be formed on the first insulation layer 106 and positioned over the first conductive layer 104. The spacers 108 serve to isolate the charge trap layer 110, such as a nitride layer, that may be deposited on the first insulation layer 106.

The second insulation layer 112 may be formed on the charge trap layer 110 between the spacers 108. The second conductive layer 114 may be formed on the second insulation layer 112. The MIM memory cell 116 is formed by the stack of the first conductive layer 104, the first insulation layer 106, the charge trap layer 110, the second insulation layer 112, and the second conductive layer 114. The position of the MIM memory cells 116 relative to the light emitting diode 304 may be adjusted to allow best exposure to the light emission 124. The light transmissive layer 118 covers the MIM memory cells 116 and a light channeling structure 602 may be formed on the light transmissive layer 118 in order to direct the light emission 124 to specific areas in the MIM memory cell array 202, of FIG. 2. The reflective layer 306, such as a metal layer, an opaque layer, or other non-transmissive layer, may be deposited on the light channeling structure 602.

The shape and material of the light channeling structure 602 may vary. The position and shape may be used to direct a portion of the light emission 124 to other sites of the MIM memory cell 116. By carefully designing the light channeling structure 602, a single instance of the light emitting diode 304 may be used to erase groups of the MIM memory cells 116. This feature may be useful to perform selective group erasure of certain on the MIM memory cells 116.

Figure 7:
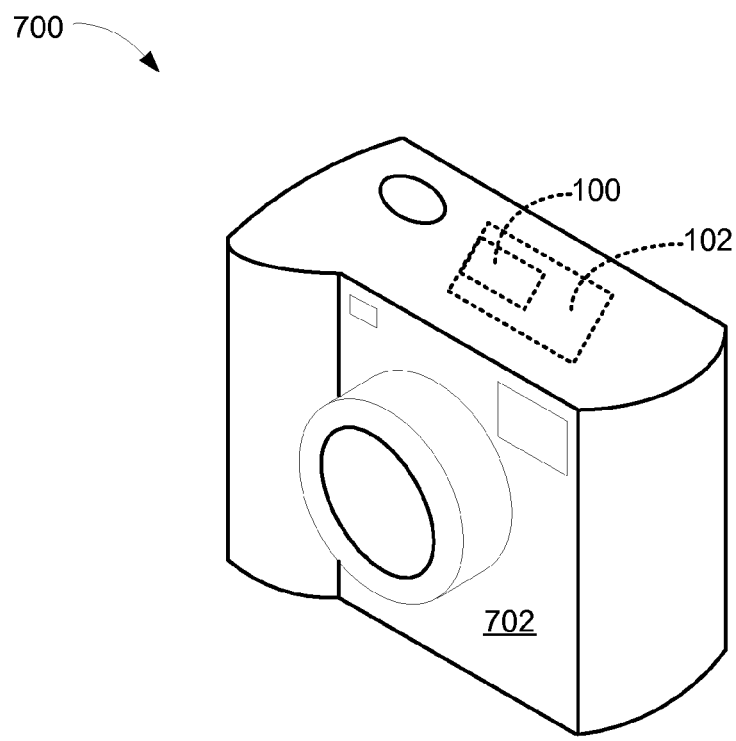
FIG. 7 is a perspective view of an optical erase memory structure application.

Referring now to FIG. 7, therein is shown a perspective view of an optical erase memory structure application 700. The perspective view of the optical erase memory structure application 700 depicts a camera 702 including the optical erase memory structure 100 on the first substrate 102. The first substrate 102 may also have additional circuitry (not shown) for storing, retrieving, and transferring the data for the camera 702.

Figure 8:
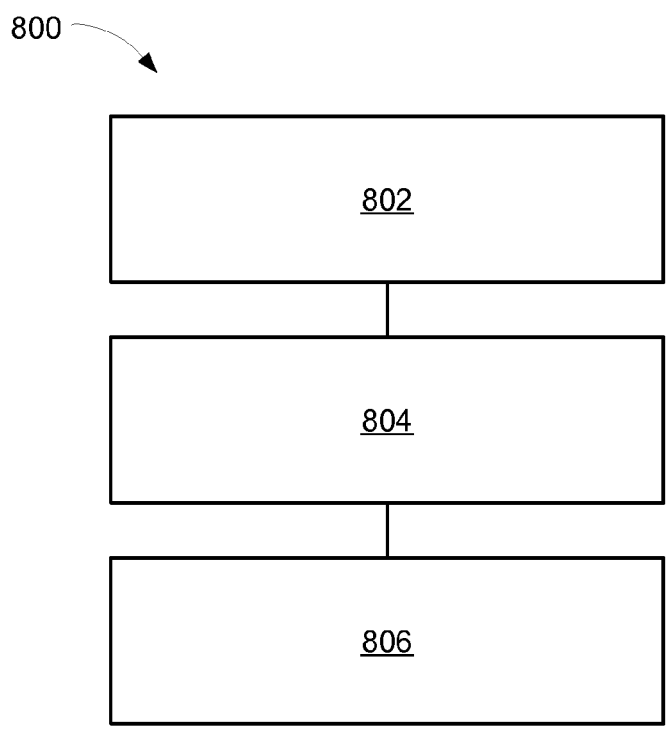
FIG. 8 is a flow chart of an optical erase memory structure for utilizing an optical erase memory structure, in an embodiment of the present invention.

Referring now to FIG. 8, therein is shown a flow chart of an optical erase memory structure 800 for utilizing the optical erase memory structure 100, in an embodiment of the present invention. The system 800 includes forming a metal-insulator-metal memory cell in a block 802; positioning a light emitting diode adjacent to the metal-insulator-metal memory cell in a block 804; and emitting a light emission from the light emitting diode for erasing the metal-insulator-metal memory cell in a block 806.

It has been discovered that the present invention thus has numerous aspects.

A principle aspect that has been unexpectedly discovered is that the present invention may reliably erase the metal-insulation-metal memory cell without applying an erasing voltage.

Another aspect is that reliably erasing the metal-insulation-metal memory cell to an erased state allows a single instance of the metal-insulation-metal memory cell to store multiple bits of information.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the optical erase memory structure of the present invention furnishes important and heretofore unknown and unavailable solutions, capabilities, and functional aspects for increasing memory density and performance. The resulting processes and configurations are straightforward, cost-effective, uncomplicated, highly versatile and effective, can be surprisingly and unobviously implemented by adapting known technologies, and are thus readily suited for efficiently and economically manufacturing memory devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for providing an optical erase memory structure including:
    forming a metal-insulator-metal memory cell having spacers that are transparent;
    positioning a light emitting diode adjacent to the metal-insulator-metal memory cell; and
    emitting a light emission from the light emitting diode through the spacers for erasing the metal-insulator-metal memory cell.

2. The method as claimed in claim 1 further comprising providing a light transmissive layer between the light emitting diode and the metal-insulator-metal memory cell.

3. The method as claimed in claim 1 further comprising depositing a reflective layer over the light emitting diode for redirecting the light emission.

4. The method as claimed in claim 1 further comprising forming a light channeling structure adjacent to the metal-insulator-metal memory cell for routing the light emission.

5. The method as claimed in claim 1 further comprising:
providing an optical erase memory structure application including mounting the optical erase memory structure therein; and
transferring a data pattern from the optical erase memory structure application to the optical erase memory structure.

6. A method for providing an optical erase memory structure including:
forming a metal-insulator-metal memory cell having spacers that are transparent including providing a charge trap layer;
positioning a light emitting diode adjacent to the metal-insulator-metal memory cell; and
emitting a light emission from the light emitting diode through the spacers for erasing the metal-insulator-metal memory cell including dissipating a charge in the charge trap layer.

7. The method as claimed in claim 6 further comprising providing a light transmissive layer between the light emitting diode and the metal-insulator-metal memory cell including providing a clear epoxy layer, a silicon dioxide layer, or a polyimide layer.

8. The method as claimed in claim 6 further comprising depositing a reflective layer over the light emitting diode for redirecting the light emission including forming a light channeling interface.

9. The method as claimed in claim 6 further comprising forming a light channeling structure adjacent to the metal-insulator-metal memory cell for routing the light emission including erasing a metal-insulator-metal memory cell array segment.

10. The method as claimed in claim 6 wherein positioning the light emitting diode adjacent to the metal-insulator-metal memory cell includes providing a complete substrate having the light emitting diode or mounting a second substrate, having the light emitting diode, over a first substrate.

11. An optical erase memory structure including:
a metal-insulator-metal memory cell with spacers that are transparent;
a light emitting diode adjacent to the metal-insulator-metal memory cell; and
a light emission from the light emitting diode through the spacers for erasing the metal-insulator-metal memory cell.

12. The apparatus as claimed in claim 11 further comprising a light transmissive layer between the light emitting diode and the metal-insulator-metal memory cell.

13. The apparatus as claimed in claim 11 further comprising a reflective layer over the light emitting diode for redirecting the light emission.

14. The apparatus as claimed in claim 11 further comprising a light channeling structure adjacent to the metal-insulator-metal memory cell for routing the light emission.

15. The apparatus as claimed in claim 11 further comprising:
an optical erase memory structure application includes a camera with the optical erase memory structure mounted therein; and
a data pattern transferred from the optical erase memory structure application to the optical erase memory structure includes picture data transferred from the camera.

16. The apparatus as claimed in claim 11 further comprising:
a charge trap layer in the metal-insulator-metal memory cell; and
a charge dissipated from the charge trap layer by the light emission.

17. The apparatus as claimed in claim 16 further comprising a light transmissive layer between the light emitting diode and the metal-insulator-metal memory cell includes a clear epoxy layer, a silicon dioxide layer, or a polyimide layer.

18. The apparatus as claimed in claim 16 further comprising a reflective layer over the light emitting diode for redirecting the light emission by a light channeling interface.

19. The apparatus as claimed in claim 16 further comprising a light channeling structure adjacent to the metal-insulator-metal memory cell for routing the light emission includes a metal-insulator-metal memory cell array segment erased.

20. The apparatus as claimed in claim 16 wherein a light emitting diode adjacent to the metal-insulator-metal memory cell includes a complete substrate having the light emitting diode or a second substrate, having the light emitting diode, mounted over a first substrate.

* * * * *